United States Patent [19]
Kano et al.

[11] 3,951,702
[45] Apr. 20, 1976

[54] METHOD OF MANUFACTURING A JUNCTION FIELD EFFECT TRANSISTOR

[75] Inventors: Gota Kano, Nagaokakyo; Satoshi Teramoto, Suita, both of Japan

[73] Assignee: Matsushita Electronics Corporation, Osaka, Japan

[22] Filed: Apr. 15, 1974

[21] Appl. No.: 460,877

[30] Foreign Application Priority Data
Apr. 20, 1973 Japan.......................... 48-45315

[52] U.S. Cl..................... 148/187; 148/188
[51] Int. Cl.²...................... H01L 21/225
[58] Field of Search............... 148/186, 187, 188

[56] References Cited
UNITED STATES PATENTS
3,484,309  12/1969  Gilbert.............................. 148/186
3,489,622  1/1970   Barson et al...................... 148/187
3,697,827  10/1972  Simon............................ 148/1.5 UX
3,717,507  2/1973   Abe................................ 148/1.5

Primary Examiner—L. Dewayne Rutledge
Assistant Examiner—J. M. Davis
Attorney, Agent, or Firm—Stevens, Davis, Miller & Mosher

[57] ABSTRACT

A method of manufacturing a junction field effect transistor wherein after a P type pre-diffused layer is formed in an N type region constituting a back gate region of a junction field effect transistor, arsenic is selectively diffused into the P type pre-diffused layer to form a gate region with a simultaneous drive-in step for the P type pre-diffused layer in order to obtain a thin channel by utilizing the pull-in effect.

3 Claims, 6 Drawing Figures

METHOD OF MANUFACTURING A JUNCTION FIELD EFFECT TRANSISTOR

The present invention relates to a method of manufacturing a junction field effect transistor by which its gate length can be made as short as possible without expense to channel thickness.

The invention is more definitely explained with reference to the following figures.

In case where, for example, a junction field effect transistor is built in a semiconductor integrated circuit, either the P channel type or N channel type of the transistor may be formed by the conventional manufacturing process under the control of depth of diffusion, but it is usual that a high frequency type of junction field effect transistor which is required to have the gate length as short as possible take the P channel construction for the following reason.

The formation of a channel layer in the deep portion a semiconductor substrate is generally unfavorable for reducing gate length since the deeper diffusion makes the longer gate length due to the lateral diffusion of the impurity. Therefore it is necessary to make the diffused region at a short distance from the surface of the semiconductor substrate when the short gate length is required. In the semiconductor integrated circuit, elements are built in an isolated N type epitaxial island which is formed on a P type silicon substrate, and consequently the conductivity type of this shallow diffused region, that is, the channel layer, must be P type.

Figure 1:
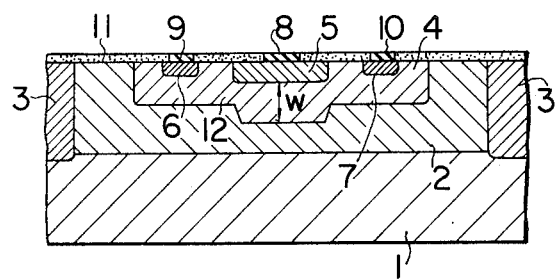
FIG. 1 is a cross-sectional view of a P channel junction field effect transistor which is built into a semiconductor integrated circuit by the conventional technologies.

FIG. 1 is a cross-sectional view of the P channel junction field effect transistor which is built into a semiconductor integrated circuit according to the foregoing object. In the diagram numeral 1 designates a P type silicon substrate, 2 an N type epitaxial island which is isolated by a P+ type diffused region 3 to constitute a back gate of the junction field effect transistor, 4 a P type diffused layer which is diffused in a shallow layer to form a channel layer, 5 an N type diffused region constituting a gate region, 6 and 7 P+ type diffused resions for ohmic contact for the provision of source and drain electrodes respectively, 8 a gate electrode, 9 a source electrode, 10 a drain electrode and 11 designates a silicon oxide film.

In the junction field effect transistor of the above-mentioned structure, as clearly shown in the figure, during the process of formation of the diffused region 5 to be served as a gate the so-called push-out effect is caused wherein a portion of the P type diffused region 4 is pushed out into the isolated N type epitaxial island 2 and unfavorably prohibits the reduction of the thickness W of a channel portion 12 which is disposed between the gate and back gate regions. The channel thickness is one of the important factors in the determination of pinch off voltage of a junction field effect transistor and in case where, for example, the channel thickness should be reduced to provide a very low pinch off voltage the abovementioned push-out effect presents a significant and unavoidable barrier.

Figure 2:
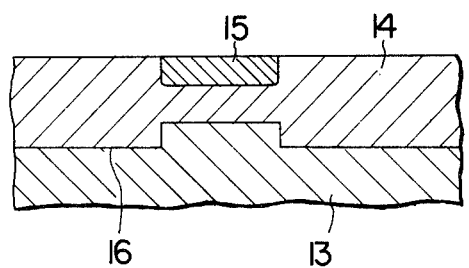
FIG. 2 is a diagram describing a pull-in effect arising from the diffusion of arsenic.

FIG. 2 is a diagram which explains the pull-in effect arising from the diffusion of arsenic used as a dopant for formation of the gate N type layer. Numeral 13 designates, for example, an N type silicon substrate, 14 a P type diffused region which is diffused into said substrate to produce the first PN junction, and 15 designates an N type diffused region wherein arsenic is diffused to produce the second PN junction.

As obviously shown in the figure the first PN junction 16 has been flat before the formation of the diffused region 15, but due to the formation of the diffused region 15 by the diffusion of arsenic the portion of the junction 16 which lies in opposition to the region 15 is pulled in to form a stepped state. Such a pull-in effect arising from the diffusion of arsenic is a well-known fact.

The object of the present invention is to eliminate the disadvantages in the above-mentioned prior art, and utilizing the pull-in effect in the process of manufacturing junction field effect transistors in order to obtain the thin channel without expense of controllability. The present invention can provide the method of reducing the thickness of the channel layer of a junction field effect transistor and of precisely controlling the same. Therefore this invention enables the manufacturing of the junction field effect transistor of a low pinch off voltage.

Thus this invention is convenient for the formation of junction field effect transistors into a semiconductor integrated circuit which is driven by a relatively low power source voltage.

Figure 3A:
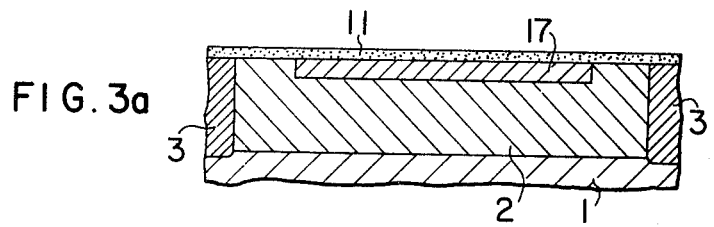
FIGS. 3a to 3d are the diagrams showing the process of building of a P channel junction field effect transistor in a semiconductor integrated circuit according to the present invention. In these figures, like reference numerals designate like elements.

The present invention will be described with reference to FIGS. 3a to 3d as follows. FIG. 3a shows the first process of manufacturing the junction field effect transistor according to the invention, wherein in the first place a P type of impurity is pre-diffused into the isolated N type island 2 which has been formed in a P type of silicon substrate 1 to produce a very shallow pre-diffused layer 17.

Figure 3B:
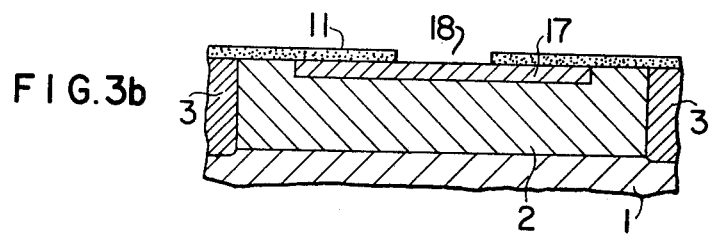

Secondly, as shown in FIG. 3b, after selectively removing a silicon oxide film 11 which is present on the P type pre-diffused layer 17 to produce an opening 18 arsenic is diffused from said opening. In the process of the arsenic diffusion the P type pre-diffused layer is further diffused into the isolated N type epitaxial island 2. In other words, in the process of formation of a gate the regions of the P type channel, source and drain are also formed and in addition the junction of the back gate is pulled in.

Figure 3C:
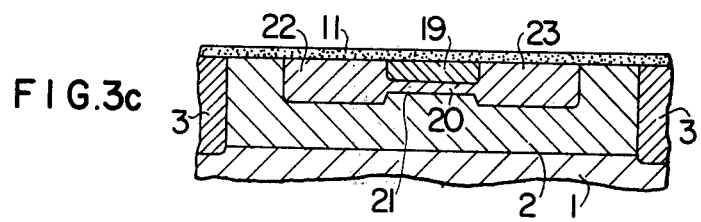

FIG. 3c indicates the state of the transistor as observed after the completion of the above-mentioned process of diffusion, wherein the thickness of the channel layer 20 under the N type diffused region 19 which has been formed by the diffusion of arsenic is made very small because a portion 21 of the back gate junction is pulled in.

Figure 3D:
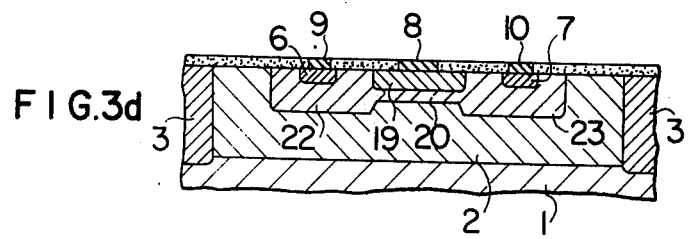

Numerals 22 and 23 designate the P type source region and the P type drain region, respectively. After the formation of the structure of FIG. 3c, electrodes 8, 9 and 10 are formed to complete the junction field effect transistor as shown in FIG. 3d according to the method of present invention.

The prime importance in the usage of the above-mentioned method is to make the depth of diffusion of the P type pre-diffused layer as small as possible and to achieve a desired depth of diffusion by the use of the process of arsenic diffusion.

Since the pull-in effect due to the diffusion of arsenic becomes less pronounced as a consequence of the increase in the depth of diffusion of the P type pre-diffused layer the above-mentioned consideration has to be taken.

The above object could be achieved in the case of the formation of the channel with the thickness, for example, of 0.3 to 0.5 microns by forming the P type pre-diffused layer having the depth of diffusion of 0.4 microns and the concentration of surface impurity of $5 \times 10^{18}$ cm$^{-3}$ by the pre-diffusion of boron, by further deposition of an oxide film containing arsenic onto said pre-diffused layer by means of chemical evaporation, and by a further 30-minute diffusion process thereof at the temperature of 1,050°C.

What we claim is:

1. A method of manufacturing a junction field effect transistor, comprising the steps of:
    a. forming a P type prediffused layer in a first N type region constituting a back gate region, the prediffused layer and first N type region providing a back gate junction;
    b. selectively removing an insulating film on the prediffused layer to provide an opening after forming the P type prediffused layer.
    c. diffusing arsenic from the opening to form a second N type diffusion region constituting an upper gate region and, in the process of diffusing the arsenic, diffusing the P type prediffused layer to a preselected depth while pulling in a portion of the back gate junction opposing the upper gate region by a pull-in effect of the arsenic; and
    d. forming a source region and a drain region in the transistor.

2. The method of manufacturing a junction field effect transistor as claimed in claim 1 wherein the step of diffusing arsenic comprises depositing an oxide film containing arsenic on the P type prediffused layer, and heat treating the oxide film and the prediffused layer.

3. The method of manufacturing a junction field effect transistor as claimed in claim 1 further comprising forming the first N type region as an isolated N type island on a P type substrate of a semiconductor integrated circuit.

* * * * *